United States Patent [19]

Buhr et al.

[11] 3,985,566
[45] Oct. 12, 1976

[54] PHOTOSENSITIVE CROSSLINKABLE 1-CARBONYLOXY-1H-NAPHTHALENE-2-ONE POLYMERS AND PROCESS FOR THEIR PREPARATION

[75] Inventors: Gerhard Buhr, Schneidhain, Taunus; Hartmut Steppan, Wiesbaden, both of Germany

[73] Assignee: Hoechst Aktiengesellschaft, Frankfurt am Main, Germany

[22] Filed: Feb. 12, 1975

[21] Appl. No.: 549,429

[30] Foreign Application Priority Data

Feb. 14, 1974    Germany............................ 2407033

[52] U.S. Cl................................. 96/115 R; 96/35.1; 204/159.14; 260/63 R; 260/63 UY; 526/328; 526/311
[51] Int. Cl.²...................... G03C 1/68; G03C 1/70; G03C 5/08; C08F 8/00
[58] Field of Search........... 260/63 R, 63 K, 63 UY; 96/115 R, 35.1; 204/159.14

[56] References Cited
UNITED STATES PATENTS

| | | | |
|---|---|---|---|
| 2,326,736 | 8/1943 | Adelson et al. | 260/63 K |
| 2,584,773 | 2/1952 | Reynolds et al. | 260/63 K |
| 2,716,097 | 8/1955 | Unruh et al. | 260/63 K |
| 3,574,617 | 4/1971 | Skoultchi | 96/35.1 |
| 3,827,960 | 8/1974 | McGinniss | 204/159.24 |

*Primary Examiner*—Murray Tillman
*Assistant Examiner*—Thurman K. Page
*Attorney, Agent, or Firm*—Curtis, Morris & Safford

[57] ABSTRACT

Polymers capable of being cross-linked by light, which comprise units having lateral substituted 1-carbonyloxy-1H-naphthalene-2-one groups of the formula

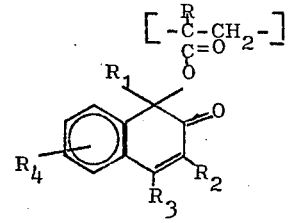

where R is hydrogen or methyl; $R_1$ is a streight-chain or branched, saturated or unsaturated hydrocarbon radical having from 1 to 3 carbon atoms, in which a hydrogen atom may be substituted by cyano, ($C_1$ to $C_2$) alkoxy, carbo-($C_1$ to $C_2$)-alkoxy, ($C_1$ to $C_2$)acyl or ($C_1$ to $C_2$)acyloxy and $R_2$ and $R_3$, independently, each are ($C_1$ to $C_4$)alkyl or chlorine; and $R_4$ is ($C_1$ to $C_4$)alkyl, nitro, chlorine or bromine, are provided.

10 Claims, No Drawings

PHOTOSENSITIVE CROSSLINKABLE 1-CARBONYLOXY-1H-NAPHTHALENE-2-ONE POLYMERS AND PROCESS FOR THEIR PREPARATION

The present invention relates to polymers capable of being cross-linked by light and a process for the preparation thereof.

Polymers the physical properties of which are altered by exposure to light are known. Above all, polymer materials containing photoreactive groups which are cross-linked under the influence of light have been described. Some of these materials are used in light-sensitive copying compositions for the manufacture of, e.g., printing plates and so-called photoresists. The special importance of cinnamic acid esters of polyalcohols, for example polyvinyl cinnamate, in this field is partially prejudiced by manufacturing processes involving the known problems of polymer-analogous reactions. For example, esterification of polyvinyl alcohol or substantially saponified polyvinyl acetate with cinnamic acid chloride cannot be carried out in a homogeneous reaction system, and it is not quantitative, which is a disadvantage in the case where a high cross-linking rate is desired, which rate depends on a number of photoactive groups as great as possible in the polymer molecule.

Efforts at overcoming these difficulties by polymerization of vinyl cinnamate while maintaining the cinnamoyl chromophore failed owing to the tendency of the monomer to react substantially according to a so-called cyclopolymerization reaction when the reaction is carried out in a dilute, maximum 30 % solution and to conversions of up to a maximum of 50 % (conditions under which polymerization proceeds without cross-linking). In the polymer obtained there was only 15 to 20 % of linear polyvinyl cinnamate (see for example Paesschen et al., Makromol.Chem. 37, 46 (1960) and J. Roovers et al., ibid. 60, 89 (1963). A polymerization in concentrated solutions and at higher conversions resulted in gelation, the polymer thus becoming insoluble in the usual solvents.

Surprisingly, it has now been found that (meth)acrylic acid esters of substituted 1-hydroxy-1H-naphthalene-2-ones may be polymerized to uncross-linked light-sensitive poly-(meth)acrylates with yields exceeding 95 % in some cases and with maintenance of the 1H-naphthalene-2-one chromophore, although also in this case the steric conditions for a cyclopolymerization proceeding via a six-membered ring exist. Thus, the incorporation of chain members between the polymerizable unit and the photoactive group, described in German Offenlegungsschrift No. 2,211,242 in the form of the reaction product of glycidyl methacrylate and cinnamic acid, may be avoided.

The (meth)acrylic acid esters of the substituted 1-hydroxy-1H-naphthalene-2-ones of the formula (I)

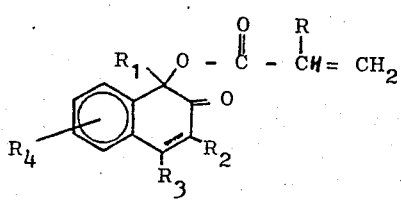

where R, $R_1$, $R_2$, $R_3$ and $R_4$ are as defined below, which are used as starting materials for the polymers of the invention, are obtained by reacting naphthalene-2-ones of the formula (II)

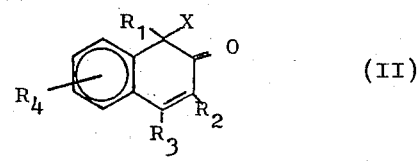

where X is halogen, preferably chlorine, or OH, with acrylic or methacrylic acid derivatives of the formula (IIIa)

$$CH_2 = CR - COY \qquad (IIIa)$$

or the corresponding β-chloropropionic acid derivatives of the formula (IIIb)

$$CH_2Cl = CHR - COY \qquad (IIIb)$$

where R is H or preferably $CH_3$, and, when X is halogen, Y is OZ and Z a monovalent cation, preferably an alkali metal cation, especially $Na^+$, $K^+$, $NH_4^+$, or alkylated ammonium, and when X is OH, Y is halogen, preferably chlorine, or $CH_2 = CR - COO -$ or $CH_2Cl - CHR - COO -$, in known manner, or optionally, when β-chloropropionic acid derivatives of formula (IIIb) are used, with excess alkali, thereby splitting off HCl, to form the compounds of formula (I).

The polymers of the invention have already a sufficient light-sensitivity with the light sources usually employed in industrial practice. Sensitizers normally required for increasing the light-sensitivity of cinnamic acid derivatives to long wave lengths may therefore be omitted. Thus, difficulties sometimes occurring when sensitizers are added to copying layers, such as poor cross-linking of lower parts of the layers because of the filtering effect of the sensitizers, or decreased adhesion because of the easy solubility of the sensitizer, or the formation of salts of these additives, do not arise.

The present invention provides polymers capable of being cross-linked by light, containing units having lateral substituted 1-carbonyloxy-1H-naphthalene-2-one groups of the formula

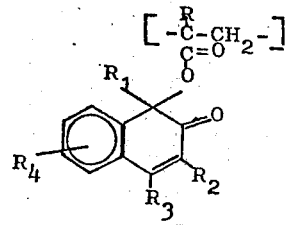

where R is hydrogen or preferably methyl; $R_1$ is a straightchain or branched, saturated or unsaturated hydrocarbon radical having from 1 to 3 carbon atoms, preferably methyl, in which a hydrogen atom may be substituted by cyano, ($C_1$ to $C_2$) alkoxy, carbo-($C_1$ to $C_2$)-alkoxy, ($C_1$ to $C_2$)acyl or ($C_1$ to $C_2$) acyloxy, preferably in ω-position; and $R_2$ and $R_3$, independently, each are hydrogen ($C_1$ to $C_4$) alkyl, preferably methyl, or chlorine; and $R_4$ is ($C_1$ to $C_4$) alkyl, preferably methyl, nitro chlorine, bromine or preferably hydrogen.

The present invention provides homopolymers consisting of the above units containing 1H-naphthalene-2-one groups, as well as, preferably, copolymers of these units and substituted non light-sensitive, ethylenically unsaturated compounds, especially methacrylic acid and the derivatives thereof. The molar ratio of photoactive 1H-naphthalene-2-one units and inactive comonomer units depends on the intended properties of the polymer, for example solubility, adhesive power, mechanical strength; and degree of cross-linking after exposure. It may vary widely, since an addition of 1 mol % of a comonomer may influence the physical properties of the polymer, and on the other hand, a content of 5 mol % or less of 1H-naphthalene-2-one units in the copolymer provides cross-linking by light. Generally, however, the amount of photoactive monomer units is from 90 to 10 mol %, preferably from 75 to 20 mol %, and the amount of photo-inactive comonomer units is from 10 to 90 mol %, preferably from 25 to 80 mol %.

As comonomers, there may be used in this connection not only chemically homogeneous compounds, but also mixtures of different polymerizable ethylenically unsaturated compounds. Thus, the polymers of the invention may consist of more than two, especially up to three, different monomer units. Also mixtures of copolymers may be used.

The present invention provides furthermore a process for the preparation of such polymers capable of being cross-linked by light which comprises polymerizing substituted 1-acryloyloxy-, or preferably 1-methacryloyloxy-1H-naphthalene-2-ones in known manner, preferably with initiation by free radicals, optionally together with non light-sensitive, copolymerizable, ethylenically unsaturated compounds, preferably methacrylic acid and the derivatives thereof.

The polymerization is carried out preferably in bulk or in solution in the presence of a solvent inert under the reaction conditions, for example benzene, carboxylic acid esters, ketones or amides, such as dimethyl formamide. As usual initiators, there may be used for example per-compounds or aliphatic diazo compounds. the polymerization temperatures depend on the activation systems and are from 40° to 120° C. The polymerization may also be carried out in suspension or emulsion.

Monomers the homo- or copolymerization of which yield polymers capable of being cross-linked by light are for example the acrylic or, preferably, methacrylic acid esters of
1-hydroxy-1-methyl-1H-naphthalene-2-one,
1-hydroxy-1-ethyl-1H-naphthalene-2-one,
1-hydroxy-1-propyl-1H-naphthalene-2-one,
1-hydroxy-1-isopropyl-1H-naphthalene-2-one,
1-hydroxy-1-(2-cyanoethyl)-1H-naphthalene-2-one,
1-hydroxy-1-(2-methoxyethyl)-1H-naphthalene-2-one,
1-hydroxy-1-(2-carbomethoxyethyl)-1H-naphthalene-2-one,
1-hydroxy-1-(2-carboethoxyethyl)-1H-naphthalene-2-one,
1-hydroxy-1,3-dimethyl-1H-naphthalene-2-one,
1-hydroxy-1,4-dimethyl-1H-naphthalene-2-one,
1-hydroxy-1,7-dimethyl-1H-naphthalene-2-one,
1-hydroxy-1,3,7-trimethyl-1H-naphthalene-2-one,
1-hydroxy-1,4,6-trimethyl-1H-naphthalene-2-one,
1-hydroxy-1-methyl-3-chloro-1H-naphthalene-2-one,
1-hydroxy-1-cyanomethyl-1H-naphthalene-2-one, and also of
1-hydroxy-1-methoxymethyl-1H-naphthalene-2-one,
1-hydroxy-1-allyl-1H-naphthalene-2-one,
1-hydroxy-1-(3-oxobutyl)-1H-naphthalene-2-one,
1-hydroxyl-1-methyl-4-chloro-1H-naphthalene-2-one,
1-hydroxy-1-methyl-3,4-dichloro-1H-naphthalene-2-one,
1-hydroxy-1-methyl-3,6-dichloro-1H-naphthalene-2-one,
1-hydroxy-1-methyl-6-bromo-1H-naphthalene-2-one and
1-hydroxy-1-methyl-6-nitro-1H-naphthalene-2-one.

Suitable non light-sensitive comonomers are for example methacrylic acid and the derivatives thereof, such as methacrylic acid methyl ester, ethyl ester, butyl ester, hexyl ester, 2-ethylhexyl ester, 2-hydroxyethyl ester, 2-methoxyethyl ester, methacrylic esters of $\omega$-hydroxy-alkyldimethyl-phosphine oxides, for example dimethyl-(methacryloyloxymethyl)-phosphine oxide and dimethyl-(3-methacryloyloxypropyl)-phosphine oxide, or mthacrylic acid amides. Suitable are furthermore methacrylic acid fufuryl ester, allyl ester, methallyl ester and propargyl ester, as well as acrylic acid and the derivatives thereof, acrylonitrile or vinyl-aromatic substances.

The copolymerization process permits the adaptation of the physical properties of the light-sensitive polymers to practically every kind of application by variation of the comonomers, modification of their quantitative ratio and of the operation mode. This is especially important for the solubility is often very critical in industrial practice.

The polymers containing 1H-naphthalene-2-one groups according to the invention are soluble, depending on their composition, in one or several of the usual solvents, for example methylene chloride, chloroform, carbon tetrachloride, 1,2-dichloro-ethane, methylglycol, acetone, butan-2-one, cyclohexanone, ethyl acetate or dimethyl formamide, as well as, optionally, also in alcohols such as methanol or ethanol.

Furthermore, there may be prepared also copolymers which, starting from a content of 70 to 75 mol % of dimethyl-($\omega$-methacryloyl-oxyalkyl)-phosphine oxide units, as described in German Offenlegungsschrift No. 2,052,569, dissolve even in water. Copolymers having a sufficient number of free acid or amino groups, which may be easily prepared within the scope of this invention, are also water-soluble in the form of the salts thereof with inorganic or organic bases or acids, and they may therefore be processed without organic solvents.

The solutions of the light-sensitive polymers may be applied as a thin layer to metal, glass or plastics surfaces and, after elimination of the solvent, they form a film adhering to the substrate. By photographic exposure to light sources usual in reproduction technology and which are rich in light of wave lengths of from 250 to 700 nm, the exposed sections are cross-linked and therefore become insoluble, while the unexposed sections may be removed by means of a solvent, so that a negative picture of the pattern is obtained.

The present invention provides furthermore the use of polymers containing 1H-naphthalene-2-one-units in light-sensitive copying compositions for various application fields of reproduction technology, copying as well as compositions containing these polymers in amounts of from 10 to 90 weight %.

Application fields for these novel copying compositions in the form of a copying layer on any carrier, for example metal (unmixed metal or alloys) paper, plastics, glass or ceramics, of a self-supporting film, or a film between two protecting plastic sheets, or a copying lacquer, that is, as solution in a sutable solvent, are for example the following; manufacture of plates for flat and offset printing, screen printing, letterpress or intaglio and, preferably, the use as photoresist for the photomechanical manufacture of resists, especially galvanic resists or etching resists, for example those for the manufacture of conductor plates, for the etching of shaped articles or for the manufacture of scales or front plates.

The copying compositions may also be used for the manufacture of single copies either by dyeing the copying layer and removing the unexposed sections by means of a solvent after exposure, or by developing the undyed layer after exposure and dyeing the picture sections by means of a suitable dyestuff solution.

Also the different melting or softening behavior of unexposed sections of the layer may be utilized for the manufacture of single copies, for example by transferring unexposed, optionally dyed parts of the layer to reception sheets, or by powdering the heated layer with pigments which preferably adhere to the unexposed sections of the layer.

It is possible to combine the copying compositions of the invention with known copying compositions, for example those containing diazo compounds, azido compounds or systems photopolymerizable or capable of being cross-linked by light, or consisting of these materials.

Furthermore the polymers of the invention may be used as light-sensitive components in coatings hardened by light such as paints and varnishes.

The following examples illustrate the invention.

EXAMPLE 1

A solution of 0.5 g of 1-methacryloyloxy-1-methyl-naphthalene-2-one and 0.5 mg of azo-bis-isobutyronitrile in 0.75 ml of benzene were freed from oxygen in a 10 ml Schlenk vessel by evacuating three times and gassing with nitrogen, and heated to 75° C for 7 hours 20 minutes. Pressure compensation was ensured by a mercury valve, which simultaneously prevented atmospheric oxygen from being introduced. Subsequently, 12 ml of acetone were added to the contents of the vessel, the polymer powder precipitating was suction-filtered and washed first with a small amount of acetone and then with ether. After drying in vacuo at room temperature, 470 mg of a polymethacrylate having intact naphthalene-2-one-chromophores in the lateral chain were obtained which were transparently soluble in methylene chloride. The UV spectrum showed a maximum extinction of $E_{1\ cm}^{1\%} = 402$ ($CH_2Cl_2$) at 309 nm. The relative viscosity was $\eta_{rel}^{25°} = 1.64$ (C = 1 [g/dl]; $CHCl_3$).

A solution of 20 ml of the homopolymer in 1 ml of chloroform was uniformly spread over a surface of 100 $cm^2$ of a plate of brushed aluminum. After evaporation of the solvent, the coated plate was exposed for 30 seconds in contact with the Kodak step wedge No. 2 and covered by a glass plate having a thickness of 1 mm. The irradiation apparatus contained four fluorescent tubes (Philips TLAK 40 W/05) placed at a distance from 4 cm from each other. The distance of the tube periphery to the surface of the plate was about 5 cm.

By immersion in methylene chloride, the sections not cross-linked by light were removed. A picture of 17 steps was obtained.

EXAMPLE 2

The operations of Example 1 were repeated, but benzene was replaced by 0.75 ml of dimethyl formamide. The solution was heated for 8 hours to 80° C, and the polymer isolated according to Example 1. 400 g of a homopolymer transparently soluble in methylene chloride were obtained the UV spectrum of which had a maximum extinction of $E_{1\ cm}^{1\%} = 401$ ($CH_2Cl_2$) at 308 nm. The relative viscosity was $\eta_{rel}^{25°} = 1,27$ (C = 1[g/dl]; $CHCL_3$). A plate of brushed aluminum coated as described in Example 1 was exposed in contact with the Kodak step wedge No. 2 to the light of a 70 W high pressure mercury vapor lamp placed at a distance of 15 cm, the light being filtered by a glass plate having a thickness of 3 mm. After development with methylene chloride, 14 steps were copied.

EXAMPLE 3

Under the conditions described in Example 1, a solution of 500 mg of 1-methacryloyloxy-1-methyl-naphthalene-2-one, 500 g of methacrylic acid methyl ester and 1 mg of azo-bis-isobutyronitrile in 1.5 ml of benzene were heated at 75° C for 7 hours. Subsequently, the contents of the vessel were dissolved in 3 ml of acetone, and the polymer precipitated by pouring this solution into 50 ml of methanol. After suction-filtration and drying in vacuo at room temperature, 0.843 g of a copolymer being transparently soluble in methylene chloride was obtained th UV spectrum of which had a maximum extinction of $E_{1\ cm}^{1\%} = 207$ ($CH_2Cl_2$) at 308 nm. The relative viscosity was $\eta_{rel}^{25°} = 1,89$ (C = 1 [g/dl]; $CHCl_3$). A plate of brushed aluminum was coated with the copolymer in the manner as described in Example 1, exposed for 2 minutes and developed. 15 steps were completely, 1 step partially copied. At an exposure according to Example 2, 14 steps were visible.

EXAMPLE 4

Under the conditions as described in Example 1, a solution of 500 mg of 1-methacryloyloxy-1-methyl-naphthalene-2-one, 500 mg of methacrylic acid ethyl ester and 1 mg of azoisobutyronitrile in 1.5 ml of benzene was heated at 75° C for 7 hours 20 minutes. The contents of the vessel were dissolved in 3 ml of acetone and the polymer precipitated by pouring the solution into 50 ml of methanol. The polymer powder suction-filtered, washed with ether and dried in vacuo at room temperature was obtained in a quantity of 807 mg and showed in its UV spectrum a maximum extinction of $E_{1\ cm}^{1\%} = 214$ ($CH_2Cl_2$) at 308 nm. The relative viscosity was $\eta_{rel}^{25°} = 1,87$ (C = 1 [g/dl]; $CHCl_3$). According to Example 1, a plate of brushed aluminum was coated with the copolymer, exposed for 2 minutes and developed. 15 steps were copied.

EXAMPLE 5

The operations of Example 4 were repeated, but instead of azo-isobutyronitrile, 1.8 mg of benzoyl peroxide was used as initiator. 818 mg of a copolymer were obtained the maximum extinction of which in the UV spectrum was $E_{1\ cm}^{1\%} = 218$ ($CH_2Cl_2$) at 308 nm. The relative viscosity was $\eta_{rel}^{25°} = 3,55$ (C = 1 [g/dl];

CHCl$_3$). According to Example 1, a plate of brushed aluminum was coated with the copolymer, exposed for 30 seconds and developed. 18 steps were copied.

EXAMPLE 6

A solution of 7.5 g of 1-methacryloyloxy-1-methyl-naphthalene-2-one, 5 g of methacrylic acid-n-butyl ester and 25 mg of azo-isobutyronitrile in 20 ml of benzene in a four-necked flask with agitator having a capacity of 100 ml was liberated from oxygen by a three-fold evacuation and gassing with nitrogen, and heated as 75° C for 8 hours ½ while stirring. During the polymerization, a mercury valve and a slight nitrogen over pressure ensured the exclusion of atmospheric oxygen. The viscous contents of the flask were dissolved in 40 ml of methylene chloride, and the polymer precipitated by pouring this solution into 250 ml of a diethyl ether/pentane mixture (3:1, V/V), suction-filtered, washed with the cited mixture and dried in vacuo at room temperature. 11.24 g of a white powder were obtained which showed a maximum extinction in the UV spectrum of $E_1{}_{cm}{}^{1\%} = 260$ (CH$_2$Cl$_2$) at 308 nm. The relative viscosity was $\eta_{rel}{}^{25°} = 1,66$ (C — [g/dl]; (CHCl$_3$). According to Example 1, a plate of brushed aluminum was coated with this copolymer, exposed for 2 minutes and developed with butane-2-one. 14 steps were completely, 2 steps partially copied.

EXAMPLE 7

The operations of Example 6 were repeated, but instead of methacrylic acid-n-butyl ester, 5 g of methacrylic acid-2-ethylhexyl ester were used. 9.70 g of a white polymer powder were obtained having a maximum extinction in the UV spectrum of $E_1{}_{cm}{}^{1\%} = 270$ (CH$_2$Cl$_2$) at 308 nm. The relative viscosity was $\eta_{rel}{}^{25°} = 2,21$ (C = 1 [g/dl]; CHCl$_3$). According to Example 6, a plate of brushed aluminum was coated 1 cm the copolymer, exposed and developed with butan-2-one. 16 steps were completely, 1 step partially copied.

EXAMPLE 8

Under the conditions as described in Example 1, a solution of 0.5 g of 1-methacryloyloxy-1-methyl-naphthalene-2-one, 0.5 g of methacrylic acid and 1.75 mg of azo-isobutyronitrile were heated at 75° C for 8 hours. Subsequently, the contents of the vessel having a soapy consistency were suspended in 10 ml of ether, and the copolymer was suction-filtered. 0.952 g of a white powder were obtained which was transparently soluble in dimethyl formamide and showed a maximum extinction in the UV spectrum of $E_1{}_m{}^{1\%} = 190$ (DMF) at 308 nm. The relative viscosity was $_{rel}{}^{25°} = 3.08$ (C = 1[g/dl]; DMF). A solution of 20 mg of the copolymer in 1 ml of DMF was uniformly spread over a surface of 100 cm$^2$ of a plate of brushed aluminum. After evaporation of the solvent in a warm air current, the plate was exposed according to Example 1 for 2 minutes and developed in dimethyl formamide. 17 steps were copied.

EXAMPLE 9

Under the conditions as described in EXAMPLE 6, a solution of 5 g of 1-methacryloyloxy-1-methyl-naphthalene-2-one, 4.7 g of methacrylic acid methyl ester, 0.3 g of methacrylic acid and 5 mg of azo-isobutyronitrile in 26 ml of benzene were heated at 75° C for 8 hours. Subsequently, 150 ml of diethyl ether were added to the viscous contents of the flask, and the fibrous terpolymer precipitating was suction-filtered, washed with ether and dried in vacuo at room temperature. 9.29 g of a polymer soluble in methylene chloride were obtained which in the UV spectrum showed a maximum extinction of $E_1{}_{cm}{}^{1\%} = 204$ (CH$_2$Cl$_2$) at 308 nm. The relative viscosity was $\eta_{rel}{}^{25°} = 1,46$ (C = 1[g/dl]; DMF). According to Example 1, a plate of brushed aluminium was coated, exposed for 2 minutes and developed. 16 steps were copied.

EXAMPLE 10

The operations of Example 9 were repeated, but instead of the ratio of methacrylic acid methyl ester to methacrylic acid of 4.7 g to 0.3 g, a ratio of 4 g : 1 g was chosen. The solid contents of the flask were triturated with ether in a mortar, the terpolymer was suction-filtered, washed with ether and dried in vacuo at room temperature. 9.47 g of polymer soluble no more in methylene chloride, but in dimethyl formamide were obtained showing a maximum extinction in the UV spectrum of $E_1{}_{cm}{}^{1\%} = 204$ (DMF) at 308 nm. The relative viscosity was $\eta_{rel}{}^{25°} = 2,72$ (C = 1[g/dl]; DMF). A plate of brushed aluminum was coated with the terpolymer in the manner as described in Example 8, exposed according to Example 1 for 2 minutes and developed in dimethyl formamide. 19 steps were copied.

EXAMPLE 11

The operations of Example 6 were repeated, but instead of 5 g of methacrylic acid methyl ester, 4.7 g of methacrylic acid butyl ester and 0.3 g of methacrylic acid were used. 11.31 g of a white terpolymer were obtained which in the UV spectrum showed a maximum extinction of $E_1{}_{cm}{}^{1\%} = 258$ (CH$_2$Cl$_2$) at 308 nm. The relative viscosity was $\eta_{rel}{}^{25°} = 1,55$ (C = 1[g/dl]; CHCl$_3$). According to Example 1, a plate of brushed aluminum was coated with the terpolymer, exposed for 2 minutes and developed with butan-2-one. 16 steps were completely, 1 step partially copied.

EXAMPLE 12

The operations of Example 11 were repeated, but instead of 4.7 g of methacrylic acid butyl ester, 4.7 g of methacrylic acid-2-ethylhexyl ester were used. The polymerization time was 7 hours 45 minutes. 10.45 g of a white terpolymer were obtained which, in the UV spectrum, showed a maximum extinction of $E_1{}_{cm}{}^{1\%} = 287$ (CH$_2$Cl$_2$) at 308 nm. The relative viscosity was $\eta_{rel}{}^{25°} = 1,47$ (C = 1[g/dl], CHCl$_3$). According to Example 1, a plate of brushed aluminum was coated with the terpolymer, exposed for 2 minutes and developed in butan-2-one.
14 steps were completely, 1 step partially copied.

EXAMPLE 13

In a four-necked flask with agitator having a capacity of 1 liter, a solution of 90 g of 1-methacryloyloxy-1-methylnaphthalene-2-one, 85.5 g of methacrylic acid-2-ethylhexyl ester, 4.5 g of methacrylic acid and 375 mg of azo-isobutyronitrile in 350 ml of benzene was liberated from oxygen in the manner described in Example 6, and heated at 75° C for 7½ hours with agitation. Subsequently, the contents of the flask were dissolved in 300 ml of methylene chloride, and the polymer precipitated by pouring this solution into 4.6 l of a diethyl ether/pentane mixture (1.87 : 1 V/V), suction-filtered, washed with the cited mixture, suspended in methanol and crushed in a household mixer, suction-filtered again and dried in vacuo at room temperature. 122.9 g of a white powder (A) were obtained which powder, in the UV spectrum, showed a maximum extinction of $E_1$ $_{cm}{}^{1\%}$ = 228 at 308 nm. The relative viscosity was $\eta_{rel}{}^{25°}$ = 1,59 (C = 1[g/dl]; CHCl$_3$). The filtrate was evaporated in vacuo, the residue absorbed in 150 ml of methylene chloride and added dropwise to 1.2 l of methanol. The fibrous polymer precipitating was suction-filtered, washed with methanol, suspended in methanol and crushed in a household mixer, again suction-filtered and dried in vacuo at room temperature. 40.6 g of a polymer (B) were obtained, which polymer in the UV spectrum showed a maximum extinction of $E_1$ $_{cm}{}^{1\%}$ = 159 (CH$_2$Cl$_2$) at 380 nm. The relative viscosity was $\eta_{rel}{}^{25°}$ = 1,21 (C = 1[g/dl]; CHCl$_3$). According to Example 1, one plate of brushed aluminum each was coated with the polymers A and B, exposed for 2 minutes and developed in butan-2-one.

17 steps were copied on the plate coated with A, and 10 on the plate coated with B.

EXAMPLE 14

In a four-necked flask with agitator having a capacity of 500 ml, a solution of 22.5 g 1-methacryloyloxy-1-methyl-naphthalene-2-one, 36 g of methacrylic acid-2-ethylhexyl ester, 1.5 g of methacrylic acid and 125 mg of azo-isobuyronitrile in 100 ml of benzene was liberated from oxygen in the manner described in Example 6 and heated at 75° C for 8 hours 20 minutes with agitation. Subsequently, the contents of the flask were dissolved in 150 ml of methylene chloride and the polymer precipitated by pouring this solution into 2 l of methanol, suction-filtered, washed with methanol, suspended and crushed in a household mixer, again suction-filtered and dried in vacuo at room temperature. 55.1 g of a white powder were obtained which, in the UV spectrum, showed a maximum extinction of $E_1$ $_{cm}{}^{1\%}$ = 158 (CH$_2$Cl$_2$) at 308 nm. The relative viscosity was $\eta_{rel}{}^{25°}$ = 1,41 (C = 1[g/dl]; CHCl$_3$). According to Example 1, a plate of brushed aluminum was coated with the terpolymer, exposed for 2 minutes and developed in butan-2-one. 14 steps were completely, one step partially copied.

EXAMPLE 15

The operations of Example 14 were repeated. In order to attain a higher polymerization degree, the amount of solvent was halved. In a four-necked flask with agitator havig a capacity of 100 ml, a solution of 7.5 g of 1-methacryloyloxy-1-methyl-naphthalene-2-one, 12 g of methacrylic acid-2-ethyl-hexyl ester, 0.5 g of methacrylic acid and 42 mg of azo-iso-butyronitrile in 16.6 ml of benzene was liberated from oxygen in the manner described in Example 6, and heated for 8 hours at 75° C. Subsequently, the contents of the flask were worked up according to Example 14, using ⅓ each of the volume of the solvents or precipitating agents employed in the cited Example. 19.71 g of a white powder were obtained which, in the UV spectrum, showed a maximum extinction of $E_1$ $_{cm}{}^{1\%}$ = 155 (CH$_2$Cl$_2$) at 308 nm. The relative viscosity was $\eta_{rel}{}^{25°}$ = 1,69 (C = 1[g/dl]; CHCl$_3$). According to Example 1, a plate of brushed aluminum was coated with the terpolymer, exposed for 2 minutes and developed in butan-1one. 16 steps were copied.

EXAMPLE 16

The operations of Example 15 were repeated. Instead of 42 mg of azoisobutyronitrile, only 21 mg were used.

18.68 g of a white powder were obtained which, in the UV spectrum, showed a maximum extinction of $E_1$ $_{cm}{}^{1\%}$ = 153 (CH$_2$Cl$_2$) at 308 nm. The relative viscosity was $\eta_{rel}{}^{25°}$ = 1,97 (C = 1[g/dl]; CHCl$_3$). According to Example 1, a plate of brushed aluminum was coated with the terpolymer, exposed for 2 minutes and developed. 17 steps were completely, one step partially copied.

EXAMPLE 17

Under the conditions as described in Example 1, a solution of 300 mg of 1-ethyl-1-methacryloyloxy-naphthalene-2-one, 285 mg of methacrylic acid-2-ethylhexyl ester, 15 mg of methacrylic acid and 1.25 mg of azoisobutyronitrile in 1 ml of benzene were heated for 8 hours at 75° C. 10 ml of methanol were added to the contents of the vessel, the polymer precipitated was suction-filtered, washed with methanol and dried in vacuo at room temperature. 555 mg of a white powder were obtaied, which, in the UV spectrum, showed a maximum extinction of $E_1$ $_{cm}{}^{1\%}$ = 192 (CH$_2$Cl$_2$) at 311 nm. The relative viscosity was $\eta_{rel}{}^{25°}$ = 1,45 (C = 1[g/dl]; CHCl$_3$). According to Example 1, a plate of brushed aluminum was coated with the terpolymer, exposed for 2 minutes and developed in butan-2-one. 16 steps were copied.

EXAMPLE 18

The operations of Example 17 were repeated; instead of 300 mg of 1-ethyl-1-methacryloyloxy-naphthalene-2-one, 300 mg of 1-methacryloyloxy-1-propyl-naphthalene-2-one were used. 557 mg of a white powder were obtained which, in the UV spectrum, showed a maximum extinction of $E_1$ $_{cm}{}^{1\%}$ = 173 (CH$_2$Cl$_2$) at 311 nm. The relative viscosity was $\eta_{rel}{}^{25°}$ = 1,56 (C = 1[g/dl]; CHCl$_3$). According to Example 1, a plate of brushed aluminum was coated with the terpolymer, exposed for 2 minutes and developed in butan-2-one. 16 steps were completely, 1 step partially copied.

EXAMPLE 19

The operations of example 17 were repeated; instead of 300 mg of 1-ethyl-1-methacryloyloxy-naphthalene-2-one, 300 mg of 3-chloro-1-methyl-1-methacryloyloxy-naphthalene-2-one were used. 577 mg of a yellow-white polymer powder were obtained, which, in the UV spectrum, showed a maximum extinction of $E_1$ $_{cm}{}^{1\%}$ = 192 (CH$_2$Cl$_2$) at 326 nm. The relative viscosity was $\eta_{rel}{}^{25°}$ = 1,46 (C = 1[g/dl]; CHCl$_3$). According to Example 1, a plate of brushed aluminum was coated with the terpolymer, exposed for 5 minutes and developed in butan-2-one. 4 steps were completely, one step partially copied.

EXAMPLE 20

Under the conditions as described in Example 1, a solution of 200 mg of 1-(2-cyano-ethyl)-1-methacryloyloxy-naphthalene-2-one, 190 mg of methacrylic acid-2-ethylhexyl-ester, 10 mg of methacrylic acid and 1.25 mg of azo-isobutyronitrile in 0.7 ml of benzene were heated for 8 hours at 75° C. The work-up was as indicated in Example 17. 355 mg of a white polymer powder were obtained which, in the UV spectrum, showed a maximum extinction of $E_1$ $_{cm}{}^{1\%}$ = 169

(CH₂Cl₂) at 314 nm. The relative viscosity was $\eta_{rel}^{25°} = 1,42$ (C = 1[g/dl]; CHCl₃). According to Example 1, a plate of brushed aluminum was coated with the terpolymer, exposed for 2 minutes and developed in butan-2-one. 17 steps were completely, one step partially copied.

EXAMPLE 21

According to Example 6, 2.91 g of 1-methacryloyloxy-1-methyl-naphthalene-2-one and 6.33 g of dimethyl-(methacryloyloxy-methyl)-phosphine oxide in 30 ml of benzene were copolymerized in the presence of 17.5 g of azo-isobutyronitrile. After 8 hours at 75° C, the contents of the flask were absorbed in methylene chloride. By means of centrifugation, gelated amounts were separated, and the polymer was precipitated by pouring the clear solution into ether. After suction-filtration and drying under reduced pressure, 6.94 g of a white, water-soluble powder were obtained which, in the UV spectrum, showed a maximum extinction of $E_{1\,cm}^{1\%} = 111$ (CH₂Cl₂) at 309 nm. The relative viscosity was $\eta_{rel}^{25°} = 2,43$ (C = 1[g/dl]; CHCl₃). According to Example 1, a plate of brushed aluminum was coated with the powder, exposed for 2 minutes and developed in a water/ethanol mixture (7 : 3 parts by volume). 12 steps were copied.

EXAMPLE 22

The operations of Example 21 were repeated, but instead of 6.33 g of dimethyl-(methacryloyloxy-methyl-phosphine oxide, 7.36 g of dimethyl-(methacryloyloxy-propyl)-phosphine oxide were used. After completed polymerization, the contents of the flask were dissolved in methylene chloride and the polymer was precipitated by pouring the clear solution into ether. 7.59 g of a white, water-soluble powder were obtained which, in the UV spectrum, showed a maximum extinction of $E_1$ $cm^{1\%} = 113$ (CH₂Cl₂) at 309 nm. The relative viscosity was $\eta_{rel}^{25°} = 1,83$ (C = 1[g/dl]; CHCl₃). A plate of brushed aluminum coated, exposed and developed according to Example 21 showed 10 steps.

EXAMPLE 23

50 g of the polymer A obtained according to Example 13 were dissolved in 950 g of trichloro-ethane, and the solution was subjected to pressure filtration via a fine filter. A slightly yellow photoresist solution was obtained which, under the condition of exclusion of light and at a temperature of about 20° C is capable of being stored for a long time.

A copper sheet laminated to a plate of phenol resin was cleaned in known manner by scouring, rinsed with acetone and dried. Subsequently, this plate was immersed in the resist solution and removed from it so slowly that a layer thickness of 2.4 microns was obtained. The sensitized plate was now exposed for 2 minutes under a pattern (negative of a wiring diagram) to a 5 KW Xenon pulse lamp (distance about 80 cm) and developed by immersion in a mixture of 80 g of xylene and 22 g of methylglycol acetate (2 minutes). After drying the free part of the copper sheet was removed by etching in one of the usual etching machines. A copied wiring diagram was obtained.

What is claimed is:

1. A polymer capable of being cross-linked by light, which comprises units of the formula

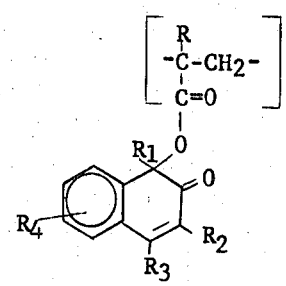

wherein R is hydrogen or methyl; R₁ is a straight-chain or branched, saturated or unsaturated hydrocarbon radical having from 1 to 3 carbon atoms in which a hydrogen atom may be substituted by cyano, (C₁ to C₂) alkoxy, carbo- (C₁ to C₂)-alkoxy, (C₁ to C₂) acyloxy; R₂ and R₃ are selected from hydrogen, (C₁ to C₄) alkyl, and chlorine; and R₄ is selected from hydrogen, (C₁ to C₄) alkyl, nitro, chlorine and bromine.

2. A polymer capable of being cross-linked by light which comprises from 10 to 90 mole percent of units of the formula

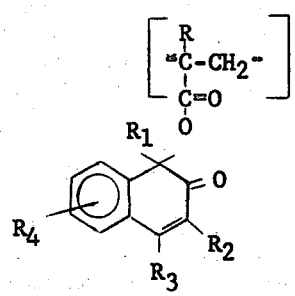

where R is hydrogen or methyl; R₁ is a straight-chain or branched, saturated or unsaturated hydrocarbon radical having from 1 to 3 carbon atoms in which a hydrogen atom may be substituted by cyano, (C₁ to C₂) alkoxy, carbo- (C₁ to C₂)-alkoxy, (C₁ to C₂) acyl or (C₁ to C₂) acyloxy; R₂ and R₃ are selected from hydrogen, (C₁ to C₄) alkyl, and chlorine; and R₄ is selected from hydrogen, (C₁ to C₄) alkyl, nitro, chlorine and bromine, and from 90 to 10 mole percent of units of one or more non-light-sensitive ethylenically unsaturated comonomers.

3. A polymer according to claim 2 wherein the comonomer is an alkyl acrylate or methacrylate.

4. A polymer capable of being cross-linked by light consisting essentially of units of the formula

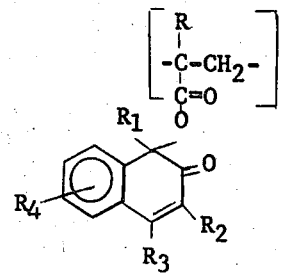

where R is hydrogen or methyl; $R_1$ is a straight-chain or branched, saturated or unsaturated hydrocarbon radical having from 1 to 3 carbon atoms in which a hydrogen atom may be substituted by cyano, ($C_1$ to $C_2$) alkoxy, carbo- ($C_1$ to $C_2$)-alkoxy, ($C_1$ to $C_2$) acyl or ($C_1$ to $C_2$) acyloxy; $R_2$ and $R_3$ are selected from hydrogen, ($C_1$ to $C_4$) alkyl, and chlorine; and $R_4$ is selected from hydrogen, ($C_1$ to $C_4$) alkyl, nitro, chlorine and bromine, and units of one or more non-light-sensitive ethylenically unsaturated comonomers.

5. A polymer capable of being cross-linked by light and comprising 10 to 90 mol percent of units derived from a 1-acryloyloxy- or 1-methacryloyloxy-naphthalene-2-one and 90 to 10 mol percent of units derived from one or more non-light-sensitive ethylenically unsaturated comonomers.

6. A homopolymer of a 1-acryloyloxy or 1-methacryloyloxy-naphthalene-2-one.

7. A copolymer of a 1-acryloyloxy or 1-methacryloyloxy-naphthalene-2-one and a non-light-sensitive ethylenically unsaturated comonomer.

8. A process for preparing a polymer capable of being cross-linked by light which comprises copolymerizing a 1-acryloyloxy- or 1-methacryloyloxy-naphthalene-2-one with one or more non-light-sensitive ethylenically unsaturated comonomers.

9. A copying composition comprising from 10 to 90 weight percent of the polymer of claim 1.

10. A copying composition comprising from 10 to 90 weight percent of the polymer of claim 2.

* * * * *